United States Patent [19]

Heinen

[11] Patent Number: 5,227,661

[45] Date of Patent: Jul. 13, 1993

[54] INTEGRATED CIRCUIT DEVICE HAVING AN AMINOPROPYLTRIETHOXYSILANE COATING

[75] Inventor: Katherine G. Heinen, Dallas, Tex.

[73] Assignee: Texas Instruments Incorporated, Dallas, Tex.

[21] Appl. No.: 586,821

[22] Filed: Sep. 24, 1990

[51] Int. Cl.[5] .................... H01L 23/48; H01L 29/44; H01L 29/52; H01L 29/60

[52] U.S. Cl. ................................. 257/669; 257/666; 257/671

[58] Field of Search ............................. 357/72, 81, 65

[56] References Cited

U.S. PATENT DOCUMENTS

| | | | |
|---|---|---|---|
| 4,395,527 | 7/1983 | Berger | 357/72 |
| 4,477,828 | 10/1984 | Scherer | 357/72 |
| 4,480,009 | 10/1984 | Berger | 357/72 |
| 4,499,149 | 2/1985 | Berger | 357/65 |
| 4,862,245 | 8/1989 | Pashby et al. | 357/81 |
| 4,916,519 | 4/1990 | Ward | 357/81 |

Primary Examiner—Andrew J. James
Assistant Examiner—Carl Whitehead, Jr.
Attorney, Agent, or Firm—B. Peter Barndt; Robby T. Holland; Richard L. Donaldson

[57] ABSTRACT

A lead over chip packaged device that is less prone to package cracking during surface mounting is disclosed. The lead over chip lead frame overlies the active face of a semiconductor circuit. The backside of the semiconductor circuit is covered with an aminopropyltriethoxysilane coating. The aminopropyltriethoxysilane coating promotes adhesion between the backside of the semiconductor circuit and the mold compound used to encapsulate the device. This reduces package cracking resulting from delamination between the inactive face of the chip and the mold compound during reflow solder.

8 Claims, 5 Drawing Sheets

INTEGRATED CIRCUIT DEVICE HAVING AN AMINOPROPYLTRIETHOXYSILANE COATING

FIELD OF THE INVENTION

This invention is related to semiconductor integrated circuit (IC) devices, and more particularly to an IC device without a chip support pad.

BACKGROUND OF THE INVENTION

An integrated circuit chip package generally includes an integrated circuit lying on a chip support pad. Wire bonds connect the IC to a lead frame. A substance, such as plastic, encapsulates the structure. The plastic small outline J lead (POSJ) package is one exemplary example. For application, one technique uses reflow solder to surface mount the IC package to a printed circuit board.

As the industry moves towards thinner packages and packages containing chips of larger size for higher volumetric packaging, new packaging techniques are evolving. One such technique is the lead over chip package, (LOC). As described in the article entitled *Volume Production of Unique Plastic Surface Mount Modules For The IBM 80-ns 1-Mbit DRAM Chip by Area Wire Bond Techniques* by William C. Ward, published at the 38th ECC in IEEE 1988, pages 552-557, this technique disposes a lead frame over the active area of a semiconductor integrated circuit chip. Adhesive insulating tape attaches the lead frame to the chip. Wire bonds connect the chip to the centrally disposed power supply busses. And, wire bonds jump over the power supply busses to connect the chip to conductive lead fingers. No chip support pad is required.

Concerns exist about potential delaminating between the molding compound used to encapsulate the LOC package and the integrated circuit chip. Delamination of mold compound can create a significant problem resulting in plastic package cracking during surface mounting the LOC package to a printed circuit board. During the reflow solder process, where the temperature may range between about 215C to 260C, the heat generated by the process can enhance the state of thermal mismatch between dissimilar materials in the IC package and create high stresses. Moisture that may be present in the encapsulating mold compound is converted to steam. The steam pressure builds at a large continuous surface, such as the die backside in a LOC package. The steam pressure can be such that it delaminates the surface of the IC and the surface of the encapsulating material. The loss of adhesion under such conditions causes a high stress concentration in the encapsulant at the corner of the IC. This often leads to package cracking. In order to avoid this problem, "dry packing" is typically required.

It is an object of this invention to provide a semiconductor device package, such as the LOC package, that is resistant to cracking during surface mount. It is the further object of this invention to provide a method of promoting adhesion in a LOC package.

Other objects and benefits of this invention will be apparent to those skilled in the art, based upon the description to follow herein.

SUMMARY OF THE INVENTION

A lead over chip packaged device that is less prone to package cracking during surface mounting is disclosed. The lead over chip lead frame overlies the active face of a semiconductor chip. The backside of the semiconductor chip is covered with an aminopropyltriethoxysilane coating. The aminopropyltriethoxysilane coating promotes adhesion between the backside of the semiconductor chip and the mold compound used to encapsulate the device. This reduces package cracking resulting from delamination between the inactive face of the chip and the mold compound during reflow solder.

BRIEF DESCRIPTION OF THE DRAWINGS

FIG. 5 is a cross section view of a tabpack package device illustrating an aminopropyltriethoxysilane coating on the inactive face of the semiconductor chip.

FIG. 6 is a cross section view of a flip-chip package device having an aminopropyltriethoxysilane coating on the inactive face of the semiconductor chip.

DETAILED DESCRIPTION OF SPECIFIC EMBODIMENT

Figure 1:
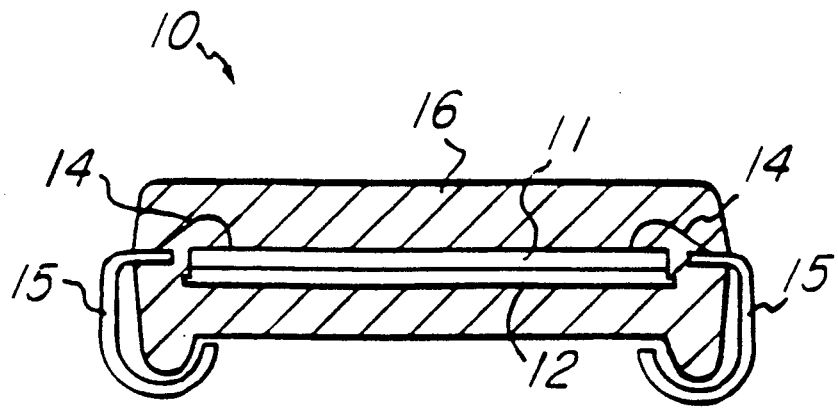
FIG. 1 is a cross section view of a typical integrated circuit device package.

FIG. 1 illustrates a packaged semiconductor device 10 constructed in the industry standard plastic small outline J-leaded (PSOJ) surface mount package. A semiconductor integrated chip 11 rests on a mount support pad (chip attach) 12. Wire bonds 14 connect the bonding pads (not shown) located along the outer edges of semiconductor chip 11 to conductive "J" shaped lead fingers 15. A mold compound material 16 such as plastic encapsulates the components.

Figure 2:
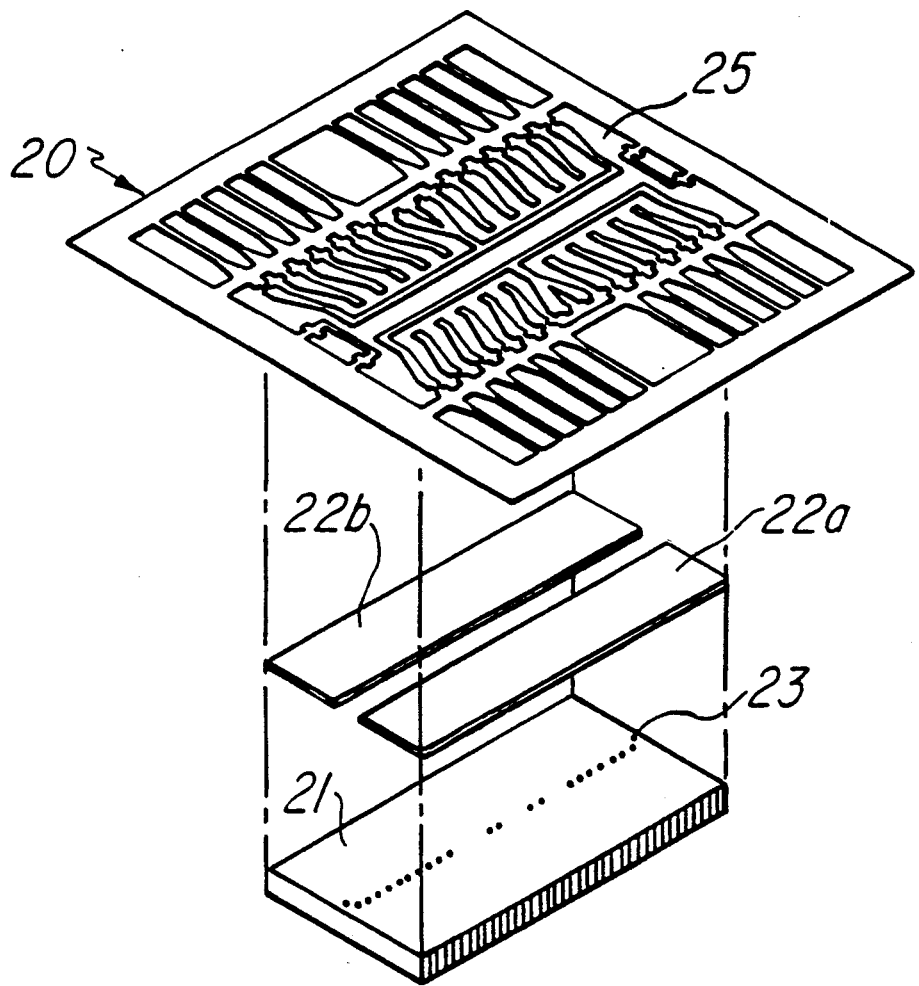
FIG. 2 is a perspective, exploded view of a lead over chip center bond device illustrating the lead frame, adhesive tape, and semiconductor chip.

FIG. 2 illustrates an initial stage of the LOC concept. The following copending and coassigned applications also describe the LOC concept:

| Serial No. | Inventor | Filed | TI-Docket |
| --- | --- | --- | --- |
| 373,742 | Heinen, et al. | 06/30/89 | 14287 |
| 455,210 | Lim, et al. | 12/22/89 | 14600 |
| 455,105 | Lim, et al. | 12/22/89 | 14603 |

In device 20 of FIG. 2, the bond pads 23 lie along the central horizontal axis of semiconductor integrated circuit chip 21. Chip 21 lies beneath lead over chip lead frame 25. Lead over chip lead frame 25 may be formed of conductive metal. An example is full hard temper CDA alloy 151 about 0.008 inches thick that may be spot plated in gold, silver, or the like. Semiconductor integrated chip 21 may be, for example, a 16 Megabit Dynamic Random Access Memory (DRAM) storing more than 16 million data bits on a semiconductor substrate about 325×660 mils in size. The memory cells and peripheral circuits are formed in and on the active surface side of chip 21. The backside of chip 21 is inactive. Two pieces of double sided adhesive tape 22a and 22b are disposed over the top active surface of semiconductor chip 21 and attach lead frame 25 over the top of semiconductor chip 21. It is this configuration that leads to the description "lead over chip", (LOC). The centrally disposed bond pads 23 lead to the further description "lead over chip center bond", LOCCB. Double sided adhesive tape 22a and 22b may comprise, for example, a double sided thermosetting epoxy adhesive coated polyimide film that also acts as an active barrier. The integrated semiconductor chip 21 and the lead frame 25 form a self supporting structure. No chip support pad is required.

Figure 2A:
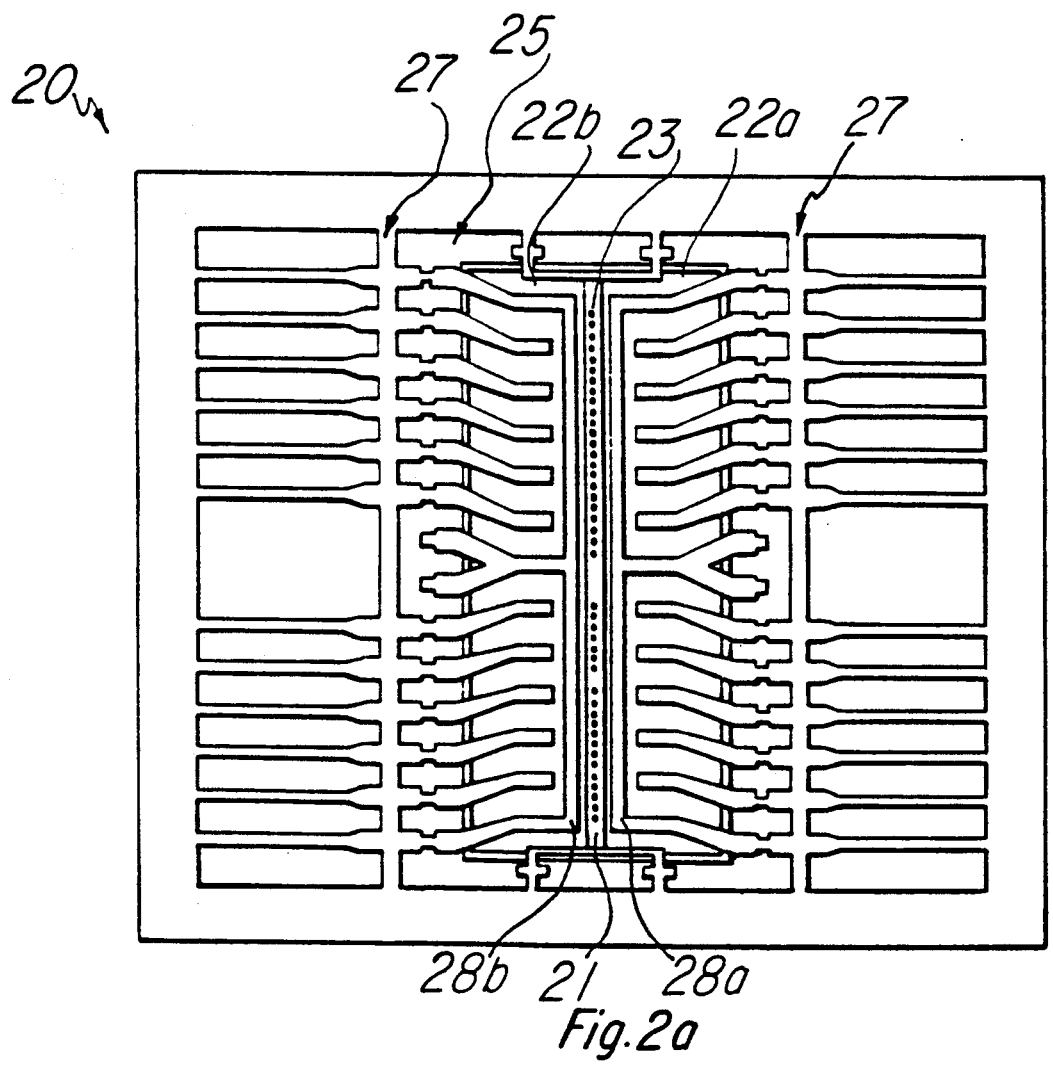
FIG. 2a is a top view of the lead over chip center bond device illustrating the connection of the semiconductor chip thereunder.

FIG. 2a depicts the resulting structure when the lead frame 25 is affixed over the integrated chip 21 in the manner shown in FIG. 2. The power busses 28a and 28b comprise spaced apart adjacent parallel conductive busses that run along the middle of the integrated chip 21. Power supply bus 28a, for example, may provide Vss and power supply bus 28b may supply Vdd. The adhesives 22a and 22b are spaced apart such that the bond pads 23 are exposed for bonding to the conductive lead fingers 27 of lead frame 25.

Figure 2B:
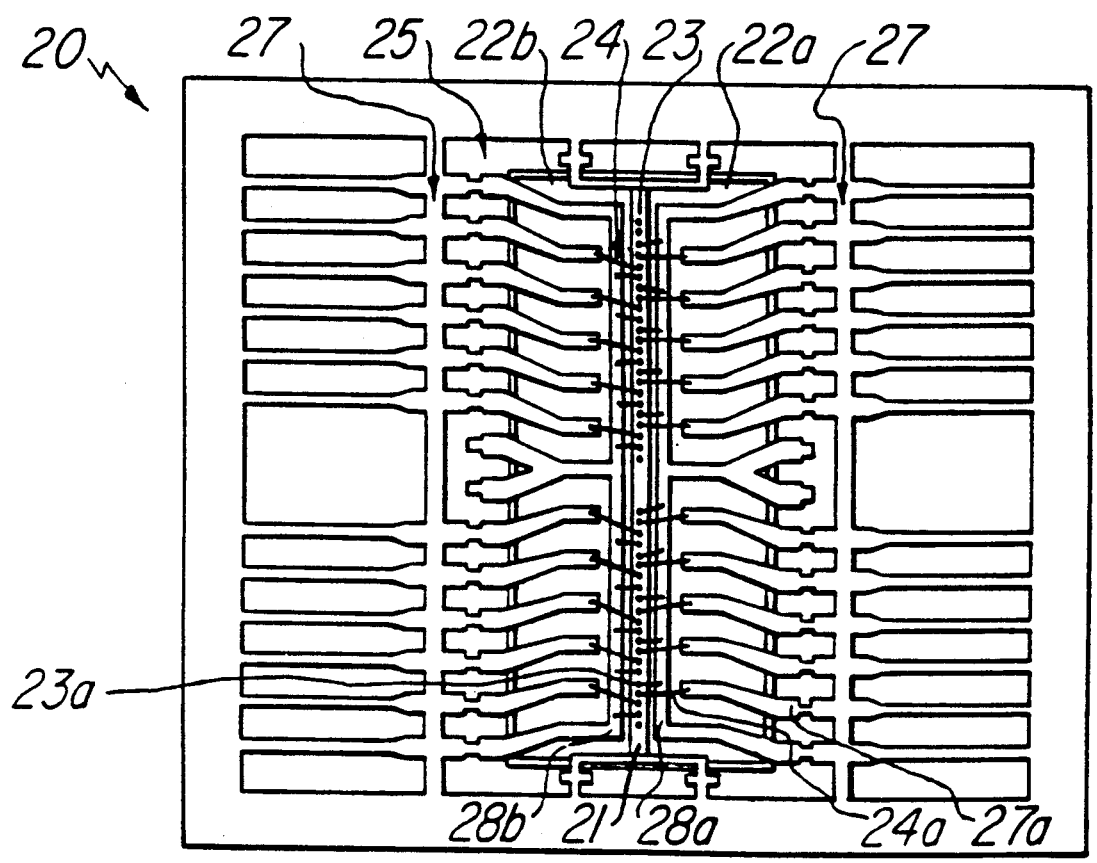
FIG. 2b is a top view of the lead over chip center bond device illustrating the connecting wire bonds.

FIG. 2b illustrates a subsequent assembly stage of device 20 wherein high speed thermosonic gold ball wire bonding is accomplished to connect the bond pads 23 to various lead fingers 27 and to the power supply busses 28a and 28b. While various types of wire bonding may be utilized, bonding using about 0.001 in diameter gold wire is sufficient. One end of the wire bonds 24 are connected to various of the bond pads 23. The other end of various wire bonds 24 are connected to the two centrally disposed power supply busses 28a and 28b of lead frame 25. Multiple wire bond contacts may be made to these busses to more efficiently distribute voltage. The other end of various wire bonds 24 cross over a power supply bus to make contact with the internal ends of the conductive lead fingers 27. Wire bond 24a is exemplary. One end of wire bond 24a is attached to the internal end of lead finger 27a. Wire bond 24a passes over power supply bus 28a where the other end of wire bond 24a is connected to bond pad 23a.

Figure 2C:
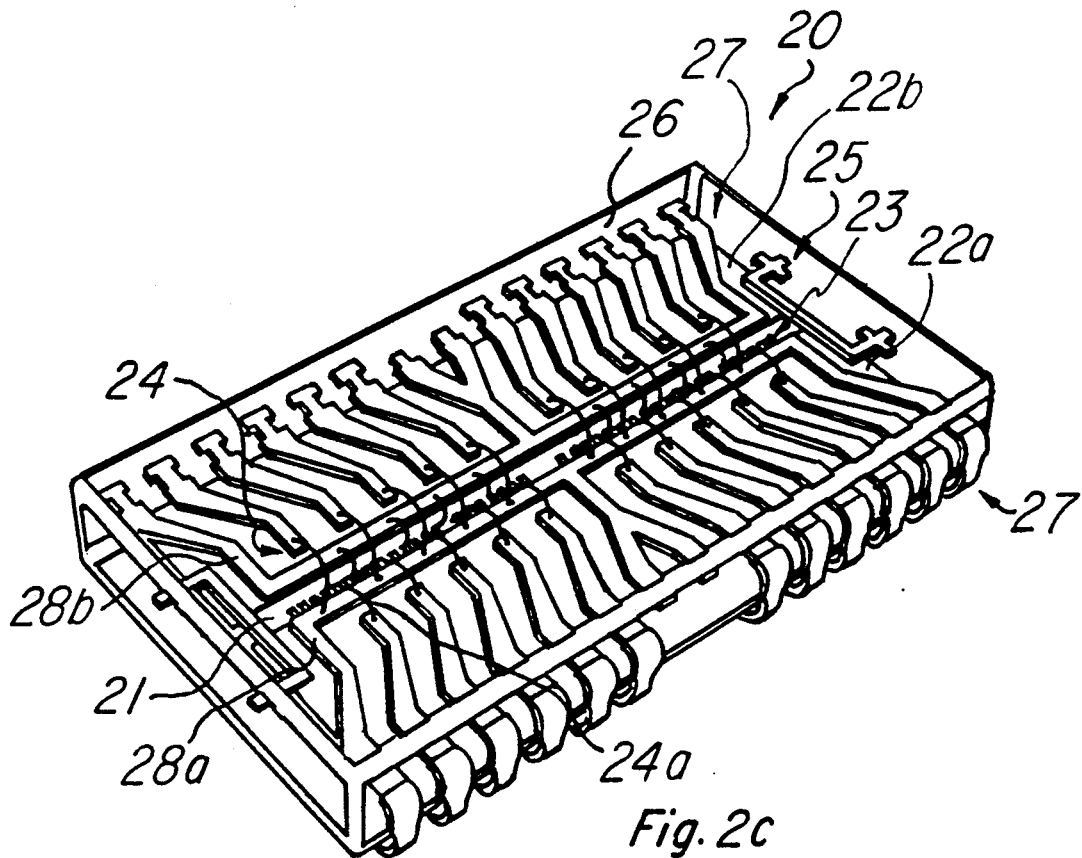
FIG. 2c is a top view of the lead over chip center bond device wherein the encapsulating mold compound is rendered transparent.

FIG. 2c illustrates device 20 in subsequent assembly stage with the plastic encapsulant 26 rendered transparent. Transfer molding is accomplished using a commercially available molding compound. Novolac plastic compounds such as Shinetsu 4011 and Hitachi 0001TS are suitable. Low stress mold techniques work well in encapsulating the device. The plastic encapsulant surrounds the integrated chip 21, the lead frame 25, and the wire bonds 24 to form a plastic body. The lead frame 25 is trimmed and the lead fingers 27 are bent in the "J" shape with the outer lead finger ends extending through the plastic encapsulant 26 so that suitable physical and electrical connection may be made with external circuitry. Twenty four lead fingers 27 extend through the plastic encapsulant.

Figure 2D:
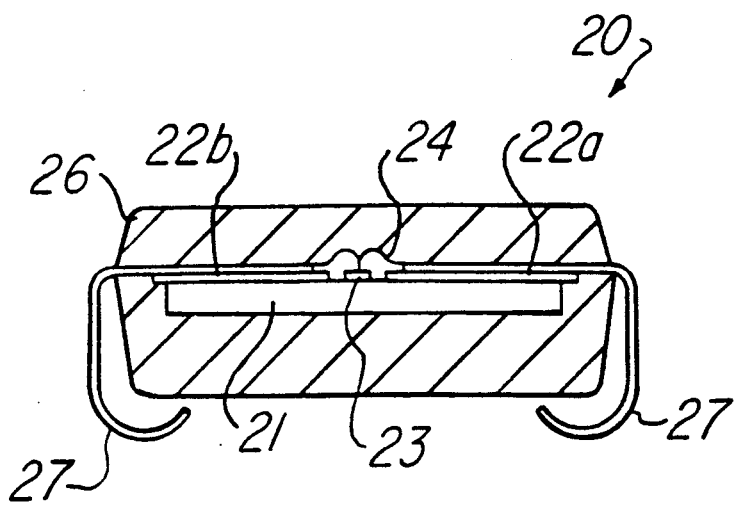
FIG. 2d is a side view of the completed lead over chip center bond package.

FIG. 2d is a side view of the completed lead over chip packaged device 20. The package size for the die size above described may be on the order of about 440×725 mils and is about 50 mils thick. The external appearance of the package is that of a 24 pin PSOJ.

Figure 2E:
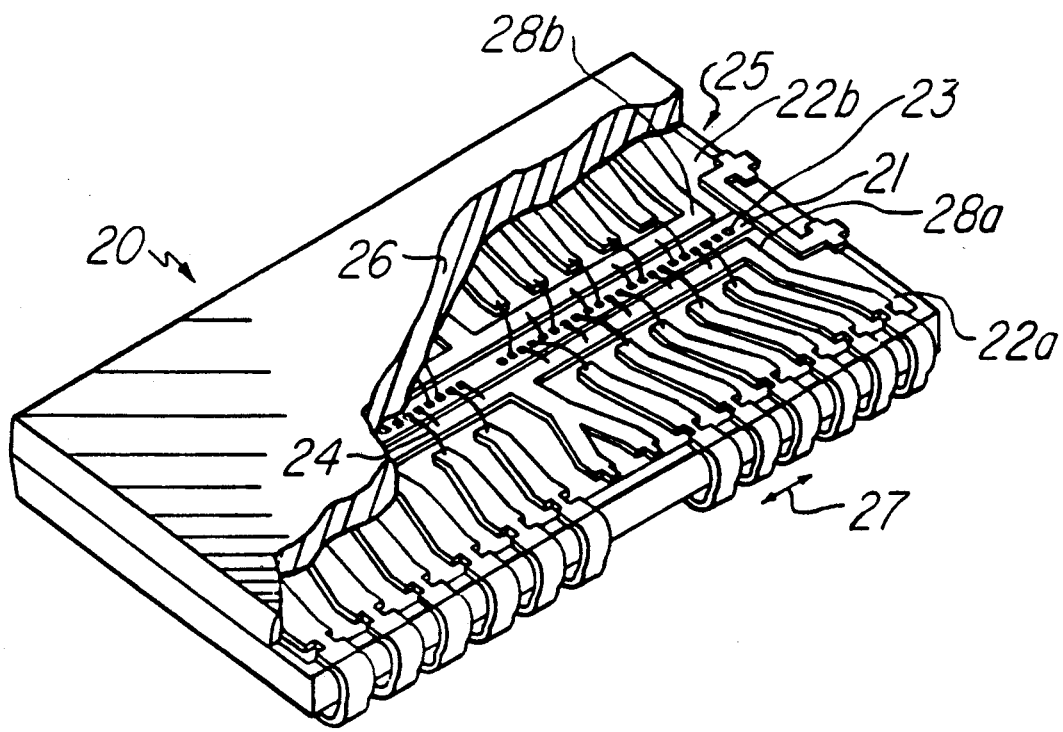
FIG. 2e is a perspective view, partially broken away, of the completed lead over chip center bond integrated circuit package.

FIG. 2e illustrates in perspective a partially cut away view of the finished LOC packaged device 20.

Figure 3:
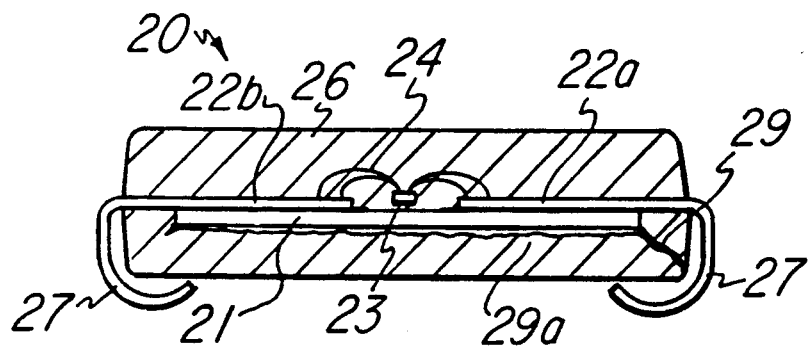
FIG. 3 is a cross section view of the LOC package illustrating a crack in the encapsulating material.

FIG. 3 is a cross section view of LOC chip package 20 illustrating a crack 29 in encapsulating material 26. The high temperatures of reflow folder may cause an enhanced state of thermal mismatch to occur between the dissimilar materials in the package creating high stresses. Moisture can be converted into steam and the ensuing steam pressure can cause delamination (illustrated as space 29a) between the inactive face of semiconductor chip 21 and encapsulating material 26. The loss of adhesion under such conditions creates a high stress concentration in the encapsulating material at the corner of chip 20 and causes crack 29.

Figure 4:
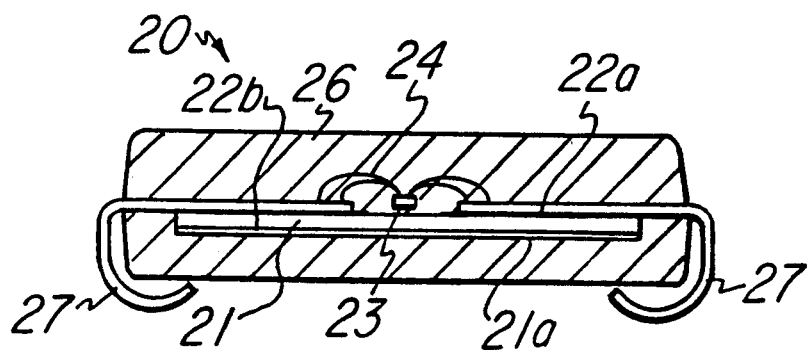
FIG. 4 is a cross section view of a LOC package illustrating an aminopropyltriethoxysilane coating on the inactive face of the semiconductor chip.

FIG. 4 is a cross section view of LOC chip 20 illustrating the preferred embodiment of the invention wherein a coating 21a of aminopropyltriethoxysilane, (sometimes hereinafter referred to as "siloxane" for short), is added to the inactive face of semiconductor chip 21. Although other suitable aminopropyltriethoxysilane formulas are satisfactory, the preferred example is the commercially available aminopropyltriethoxysilane duPont VM651. The thickness of layer 21a is not critical, although, enough siloxane to provide complete coverage of the chip backside is preferred. The siloxane film 21a may range up to about 1 micron thick and still be suitable, although, in the preferred embodiment, the depth of siloxane layer 21a is less than 1 micron.

The application of siloxane coating 21a in LOC package 20 of FIG. 4 may advantageously occur at "back-end" (i.e., after bonding semiconductor chip 21 to lead frame 25) or at "front-end" (i.e., following all the other process which effect the back of the wafer that yields the semiconductor chip, but prior to dicing the silicon wafer into individual dies). In the "front-end" approach, the siloxane coating is flat since the wafers are spun to evenly spread the coating.

Test results confirm that the addition of siloxane coating 21a to the backside of a semiconductor chip in a LOC package substantially reduces package cracking. IC packages having moisture in them were surface mounted to a printed circuit board by reflow solder. Two different types of IC packages were used: a LOC packaged device as in FIGS. 2—2e; and a LOC package device as in FIG. 4 wherein a siloxane coating was applied to the inactive backside face of the semiconductor chip. The PSOJ packages were about 400×725 mils in size and the encapsulated semiconductor chips were about 325×660 mils in size. The IC packages were subjected to a 85C/88%RH environment for over 100 hours to introduce moisture. They were then surface mounted to a printed circuit board by reflow solder at a temperature between about 215C and 220C. In the LOC packages without the siloxane coating, 83 out of 219 packages cracked. In the LOC packages with the siloxane coating, 0 out o 42 packages cracked.

While the addition of siloxane coating 21a serves to reduce package cracking, it also yields other advantages. There is no need for "drying", by baking, of the IC packages before surface mounting in order to avoid package cracking. There is also no need for "dry packing" (baking of the IC packages followed by placing them in hermetic bags) for shipment to customers.

The siloxane coating may also be utilized in other packages that do not use a chip support pad. Illustrative are packages such as the TABPAK package (wherein the lead fingers extend over to the bonding pads of the chip for direct bonding), and the flip chip package (wherein the silicon chip is "flipped" so that its inactive backside points to the top of the package and the lead fingers extend below the bonding pads on the active face of the chip for fusion bonding). FIG. 5 depicts a cross section view of a tabpack package device 40 wherein the semiconductor chip 41 has an aminopropyltriethoxysilane coating 49 on its inactive backside. Wirebonds are not used. The leadfingers 45 extend to the bonding pads 42 and may be bonded by fusion to them. A very thin package results. FIG. 6 illustrates a cross section view of a flip-chip package device 50 having an aminopropyltriethoxysilane coating 59 on the backside of its semiconductor integrated circuit chip 51. Neither tape, nor wirebonds, nor chip mount pad are used. The chip 51 is "flipped" so that its inactive backside points to the top of the package. The leadfingers 55 extend to the bonding pads 52 on the active face of the chip and may be bonded by fusion to them.

While this invention has been described with reference to illustrative embodiments, this description is not intended to be construed in a limiting sense. Various other embodiments of the invention will be apparent to persons skilled in the art upon reference to this description. It is therefore contemplated that the appended claims will cover any such modification or embodiments as fall within the true scope of the invention.

What is claimed is:

1. A semiconductor integrated circuit chip adapted for mounting to a lead over chip lead frame, comprising:

an integrated circuit chip having an active face and an inactive backside, the active face attached to a lead over chip lead frame; and an aminopropyltriethoxysilane coating on the inactive backside of the integrated circuit chip.

2. The semiconductor integrated circuit chip of claim 1 wherein the aminopropyltriethoxysilane coating is less than 1 micron thick.

3. An semiconductor packaged device, comprising:

a semiconductor circuit chip having an active face and a backside;

a lead frame to support the semiconductor chip and to provide external connection thereto, the lead frame having lead fingers connected by one end to the semiconductor chip;

an encapsulant, encapsulating the semiconductor chip and the lead frame, other ends of the lead fingers extending through the encapsulant; and wherein the semiconductor chip has an aminopropyltriethoxysilane layer on its backside to promote adhesion to the encapsulant.

4. The semiconductor packaged device of claim 3 wherein the aminopropyltriethoxysilane layer is up to 1 micron thick.

5. The integrated packaged device of claim 4 wherein the encapsulant is plastic.

6. The integrated packaged device of claim 5 wherein the lead frame is a lead over chip lead frame.

7. The integrated packaged device of claim 5 wherein the lead frame is a tabpak tape.

8. The integrated packaged device of claim 5 wherein the lead frame is a flip chip lead frame.

* * * * *